(12) United States Patent
Kidono et al.

(10) Patent No.: US 7,176,911 B1
(45) Date of Patent: Feb. 13, 2007

(54) SOLID-STATE IMAGING APPARATUS

(75) Inventors: Masami Kidono, Tokyo (JP); Hideaki Yoshida, Tokyo (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 09/496,374

(22) Filed: Feb. 2, 2000

(30) Foreign Application Priority Data

Feb. 2, 1999 (JP) .................................. 11/024627

(51) Int. Cl.
  G09G 5/00 (2006.01)
  H04N 5/225 (2006.01)
  H04N 9/04 (2006.01)

(52) U.S. Cl. .................................. 345/207; 348/207.99

(58) Field of Classification Search ................ 345/204, 345/205, 207, 210, 214, 690, 697; 348/76, 348/218, 207; 600/109
  See application file for complete search history.

(56) References Cited

U.S. PATENT DOCUMENTS

| | | | | |
|---|---|---|---|---|
| 4,803,562 A | * | 2/1989 | Eino ............................. | 358/98 |
| 5,757,423 A | * | 5/1998 | Tanaka et al. ............... | 348/218 |
| 5,880,781 A | * | 3/1999 | Udagawa et al. ........... | 348/279 |
| 6,476,941 B1 | * | 11/2002 | Kondo et al. ................ | 358/513 |
| 6,760,069 B2 | * | 7/2004 | Yanai .......................... | 348/273 |

FOREIGN PATENT DOCUMENTS

| JP | 09-298755 | | 11/1997 |
|---|---|---|---|
| JP | 10-136244 | * | 5/1998 |
| JP | 10-150601 | * | 6/1998 |
| JP | 10150601 A | * | 6/1998 |
| JP | 2000-134540 | | 5/2000 |
| JP | 2000-286408 | | 10/2000 |

* cited by examiner

*Primary Examiner*—Bipin Shalwala
*Assistant Examiner*—Jeff Piziali
(74) *Attorney, Agent, or Firm*—Straub and Pokotylo; John C. Pokotylo

(57) ABSTRACT

A plurality of pixel sets, each having 16 pixels are vertically provided successively one after another. A vertical transfer path 2 has two groups a and b of transfer electrodes 1a, 1b to 16a, 16b. Two like sequence transfer electrodes in the two electrode groups are provided for each of the pixels in each set. Each pixel is connected via a shift gate 3 to each transfer channel corresponding to each of the transfer electrodes in the electrode group a. To the transfer electrodes in the electrode group a, independent shift/transfer pulse application lead lines 4A are connected for applying independent gate pulses to the individual shift gates in addition to transfer pulses. Common lead lines are connected to the transfer electrodes 2a and 4a, 5a and 7a, 10a, 12a, and 13a and 15a. Transfer pulse application lead lines 4B are connected to the transfer electrodes in the electrode group b. Thus, a CCD imaging device is constructed, which is capable of performing a desired read-out operation by 4-phase driving. A solid-state imaging device capable of reducing the numbers of lead lines for shift gate control gate electrodes for charge read-out to a vertical transfer path and external circuit connection terminals and capable of a special read-out, such as a multiple rate read-out is realized.

23 Claims, 7 Drawing Sheets

FIG.2

| | | | | | | | |
|---|---|---|---|---|---|---|---|
| 1ST LINE | R | G | R | G | R | G | .. |
| 2ND LINE | G | B | G | B | G | B | .. |
| 3RD LINE | R | G | R | G | R | G | .. |
| 4TH LINE | G | B | G | B | G | B | .. |
| 5TH LINE | R | G | R | G | R | G | .. |
| 6TH LINE | G | B | G | B | G | B | .. |
| 7TH LINE | R | G | R | G | R | G | .. |
| 8TH LINE | G | B | G | B | G | B | .. |

FIG.4

SOLID-STATE IMAGING APPARATUS

BACKGROUND OF THE INVENTION

The present invention relates to solid-state imaging apparatuses capable of special read-out, such as read-out at a desired magnified rate, and more particularly to a solid-state imaging apparatus permitting special read-out capable of reducing the numbers of lead lines and connection electrodes to connect shift gate control gate electrodes to an external circuit.

Recently, development of so-called electronic still cameras, which are electronic imaging apparatuses capable of inputting image data to multi-media systems, is in force. The electronic still camera usually uses a solid-state imaging unit, such as a CCD imaging device, for obtaining images. The image obtained in such a camera is displayed on a liquid crystal panel of like view-finder, and can also be recorded in a recording medium in response to the depression of a trigger by the user. It has been demanded to further improve the image quality and operation control property of the electronic camera. To meet these demands it is indispensable to use a CCD imaging device having a large number of pixels and also that it is desirable to real time confirm image of the same view angle as picked-up image with a view-finder.

By using a high density pixel CCD imaging element, however, although the high quality image is obtainable, the rate of reading out one frame image is reduced, and images which are recognized as motion picture images can not be displayed on the view-finder.

To cope with this problem, Japanese Patent Laid-Open No. 10-136244, for instance, proposes line addition read-out, in which charge of each pixel in a row in an array are added together, or thin-down read-out, in which pixels in columns are thinned down. Such read-out permits high rate frame-by-frame read-out of the image, although image quality is sacrificed. It is thus made possible to cope with the motion picture image display problem.

However, the disclosed line addition or thin-down read-out method(s) is proposed for non-interlace systems, and no specific technique of high rate read-out system has been disclosed for any interlace system.

FIG. 6 shows a construction which is conceivable in the case where the interlace system is applied to the usual inter-line type CCD imaging device. This example is of four-phase drive type with a least recurrence unit of two pixels. For the sake of the brevity, 16 pixels are shown as a set. These sets of pixels are arranged successively one after another in the vertical direction of vertical transfer path. In the Figure, reference numerals 1 to 16 within rectangles each designate each pixel 1. A vertical transfer path 2 has two groups a and b of vertical transfer electrodes 1a, 1b to 16a, 16b. Two like sequence transfer electrodes in the two electrode groups are provided for each of the pixels in each set. Each pixel 1 is connected via a shift gate 3 to each transfer channel in the vertical transfer path 2 corresponding to each of the transfer electrodes 1a to 16a in the electrode group a. The vertical transfer electrodes are connected to corresponding ones of four shift pulse application lead lines 4, via which 4-phase shift pulses out of phase by ¼ cycle with one another are applied. The 4-phase transfer pulses are successively applied to the transfer electrodes, which are grouped in groups each of four transfer electrodes, whereby the charge read out via the shift gates to the vertical transfer path 2 are transferred in one direction. In FIG. 6, reference numeral 5 designates connection electrodes for connecting the lead lines 4 to an external circuit.

Of the transfer electrodes in the vertical transfer path 2, those 1b to 16b in the electrode group b merely serve for the charge transfer. The transfer electrodes 1a to 16a in the electrode group a, on the other hand, do not only serve for the charge transfer, but also serve as common gate pulse application electrodes for turning on the shift gates 3. Thus, while a charge transfer operation is caused by application of a normal shift pulse, when a voltage in excess of a predetermined voltage as a predetermined timing is selectively applied to predetermined transfer electrodes in the electrode group a, the shift gates 3 corresponding to the selected transfer electrodes are turned on to cause the pixel charge read-out to the vertical transfer path 2.

In the case of the 4-phase drive, four transfer channels of the vertical transfer path corresponding to 4-frame transfer electrode unit, for instance, the transfer electrodes 1a, 1b and 2a, 2b, constitutes a unit, so that only charge for only one pixel can be read out. Thus, the pixels that are involved in the shift along the vertical transfer path 2 correspond in number to one half the intrinsic number of vertically arranged pixels. This corresponds to the scanning in the interlace system.

In the CCD imaging device of the above interlace system, a construction as shown in FIG. 7 is conceivable when a high rate (or multiple rate) read out system or like special drive system is to be applied. In this example, the transfer electrodes 1b to 16b in the electrode group b in the vertical transfer path 2 perfectly have only bearing on the charge transfer, and like the 4-phase drive interlace system CCD imaging device shown in FIG. 6 they are connected commonly for every 4-frame transfer electrode unit. The transfer electrodes 1a to 16a in the electrode group a, on the other hand, are for special driving, have to let them also function as shift gate electrodes. The gate pulse should be independently applied to the gate electrode. Thus, it is necessary to provide independent gate pulse application lead lines to all the transfer electrodes 1a to 16a in the electrode group a. However, since in this case a 16-pixel unit recurrence system is adopted, 16 lead lines 4A are provided for independent gate pulse application to the transfer electrodes. While two lead lines are basically provided for the transfer electrodes in the electrode group a, 14 lead lines are newly provided. In addition, two lead lines 4B are provided for the transfer electrodes in the electrode group b. Thus, the total number of lead lines is 18. In FIG. 7, reference numeral 6 designates connection electrodes for connecting the independent gate pulse application lead lines 4A to an external circuit.

The above construction of the CCD imaging device with a successive arrangement of a plurality of pixel groups, in which independent shift gate pulse application lead lines are provided in correspondence to the individual pixels in each pixel group for high rate read-out by appropriately adding together charge of a desired number of pixels, is also disclosed in, for instance, Japanese Patent Laid-Open No. 10-150601. However, this case and also the construction shown in FIG. 7, have a problem that large numbers of lead lines and external circuit connection electrodes should be provided in connection with the independent gate pulse application via the transfer electrodes in correspondence to the number of pixels in each of the successive pixel groups.

SUMMARY OF THE INVENTION

The present invention was made for solving the above problem in the prior art solid-state imaging device, in which the vertical transfer path is provided with lead lines for independent gate pulse application to the shift gates to permit read-out drive in many different read-out modes.

An object of the present invention is to provide a solid-state imaging device capable of reducing the numbers of the lead lines for the gate pulse application to the shift gates and the external circuit connection terminals and capable of special read-out such as read-out at a desired multiple rate.

According to a first aspect of the present invention, there is provided a solid-state imaging device comprising: a pixel unit constituted by a two-dimensional array of pixels for generating charge in correspondence to received light and accumulating the charge for a predetermined period of time; a vertical transfer unit for vertically transferring charge from the pixels in the pixel unit, a horizontal transfer unit for horizontally transferring charge from the vertical transfer unit; shift gates each provided between each pixel and the vertical transfer unit for reading out the charge in the pixels to the vertical transfer unit, gate electrodes for controlling the shift gates; and a plurality of lead lines and a plurality of connection terminals for connecting the gate electrodes to an external circuit, the gate electrodes within successive pixel rows belonging to each coset of modulo N (N being a predetermined natural number between 4 and one half the number of pixels in a column) being combined with N gate electrode groups to reduce number of the external connection terminals.

According to a second aspect of the present invention, there is provided a solid-state imaging device comprising: a pixel unit constituted by a two-dimensional array of pixels for generating charge in correspondence to received light and accumulating the charge f or a predetermined period of time; a vertical transfer unit for vertically transferring charge from the pixels in the pixel unit, a horizontal transfer unit for horizontally transferring charge from the vertical transfer unit; shift gates each provided between each pixel and the vertical transfer unit for reading out the charge in the pixels to the vertical transfer unit, gate electrodes for controlling the shift gates; and a plurality of lead lines and a plurality of connection terminals for connecting the gate electrodes to an external circuit, the gate control lines within successive pixel rows belonging to each coset of modulo N (N being a predetermined natural number between 4 and one half the number of pixels in a column) being combined with each other so as to reduce number of the external connection terminals.

According to a third aspect of the present invention, there is provided a solid-state imaging device comprising: a pixel unit constituted by a two-dimensional array of pixels for generating charge in correspondence to received light and accumulating the charge for a predetermined period of time; a vertical transfer unit for vertically transferring charge from the pixels in the pixel unit, a horizontal transfer unit for horizontally transferring charge from the vertical transfer unit; shift gates each provided between each pixel and the vertical transfer unit for reading out the charge in the pixels to the vertical transfer unit, gate electrodes for controlling the shift gates; and a plurality of lead lines and a plurality of connection terminals for connecting the gate electrodes to an external circuit, the gate electrodes being provided in a predetermined number N (N being a predetermined natural number between 4 and one half the number of pixels in a column) of gate electrode groups such that horizontal line number of the gate electrode groups which are connected to respective common lead lines belong to each same residue class of modulo N, some of the gate electrode groups being commonly connected so that the connection electrodes are less in number than N.

The commonly connected gate electrode groups are always controlled in the same way in each of all predetermined read-out modes including selective pixel read-out modes by selective shift gate driving.

The gate electrode groups controlled in each of all the predetermined read-out modes are set such as to provide a minimum number of connection terminals for connecting the gate electrodes to an external circuit.

With the common connection of some of the gate electrode groups, it is possible to realize a solid-state imaging device capable of reducing the numbers of lead lines and connection terminals for connecting the gate electrodes to an external circuit and capable of performing a special read-out, such as a desired multiple rate read-out.

Other objects and features will be clarified from the following description with reference to attached drawings.

BRIEF DESCRIPTION OF THE DRAWINGS

FIG. 2 is a view showing the arrangement of Bayer array color filters;

FIG. 4 is a view showing read-out manners in various read-out modes obtainable with the embodiment of the CCD imaging device shown in FIG. 3;

PREFERRED EMBODIMENTS OF THE INVENTION

Preferred embodiments of the present invention will now be described with reference to the drawings.

Figure 1:
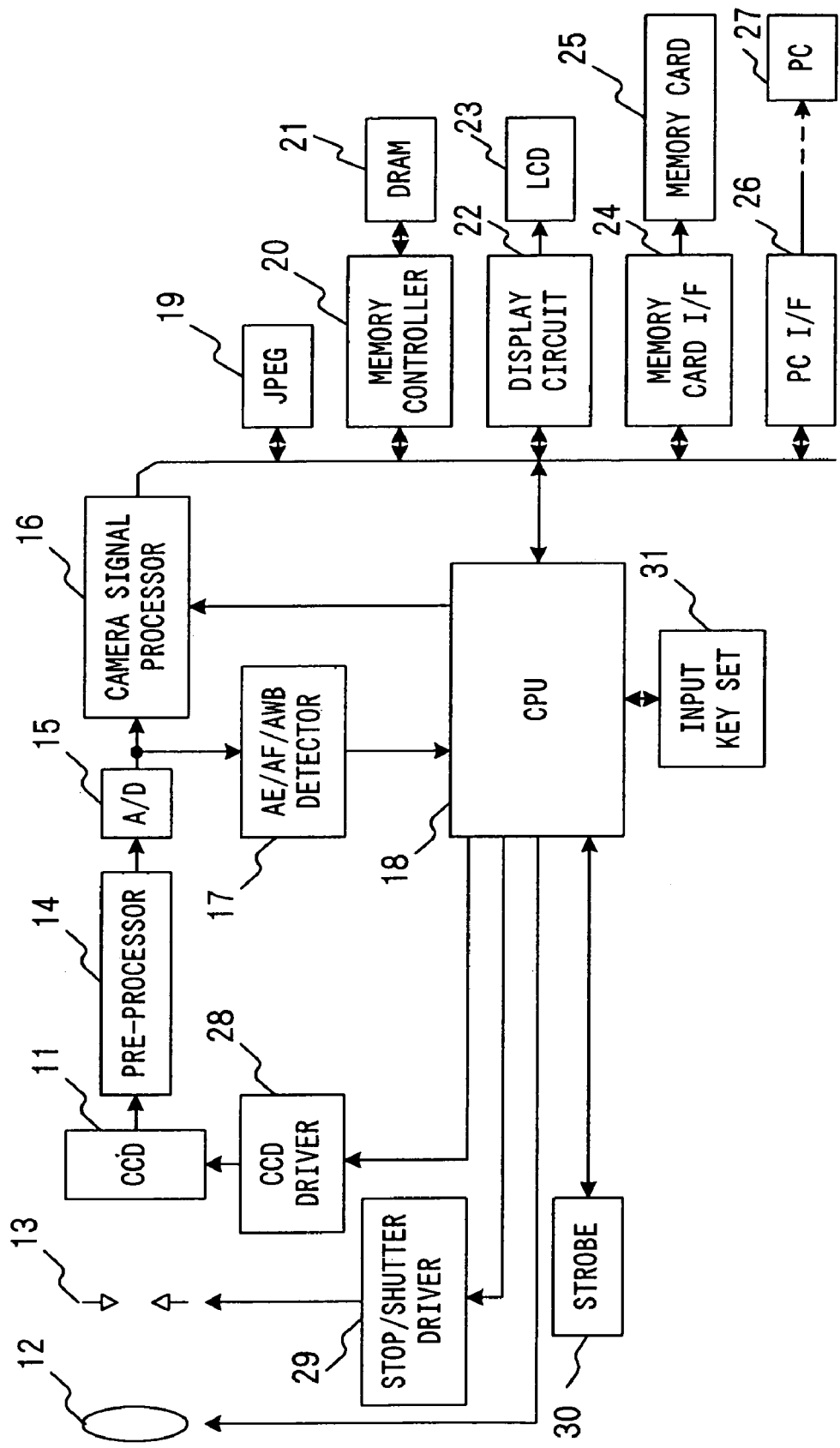
FIG. 1 is a block diagram showing the overall construction of an electronic camera using a CCD imaging device as an embodiment of the solid-state imaging device according to the present invention.

FIG. 1 is a block diagram showing the overall construction of an electronic camera sing a CCD imaging device as an embodiment of the solid-state imaging apparatus according to the present invention.

Referring to the Figure, reference numeral 11 designates a single plate color CCD imaging device, which photoelectrically converts light to an electric signal and has an electronic shutter function. A scene light flux can be inputted through a lens 12 and a stop-shutter mechanism 13 to the CCD imaging device 11. The output of the CCD imaging device 11 is subject to noise removal and amplification in a pre-processor 14, which includes a correlated double-sampling circuit and a pre-amplifier. An A/D converter 15 converts the output of the pre-processor 14, inputted as analog data, to digital data. A camera signal processor 16 processes the signal from the CCD imaging device 11 as image data. An AF/AE/AWB detector 17 includes an AF detector for generating AF data for focus control on the basis of the image signal from the CCD imaging device 11 prior to the intrinsic photography, an AE detector for generating AE data for exposure control and an AWB detector for generating an AWB data for white balance level setting. The AF, AE and AWB data from the AF/AE/AWB detector 17 are supplied through a CPU 18 to the lens 12, the stop/shutter mechanism 13 (via stop/shutter driver 29) and the camera signal processor 16, respectively.

A compressor (JPEG) 19 compresses the data quantity. Thus compressed image data which has been compressed in the compressor 19, is supplied via a memory card interface 24 to a detachably loaded memory card 25 for recording in the same. A memory controller 20 and a DRAM 21 are used as working memories for the color processing of the image data. A display circuit 22 and a an LCD display 23 are used for reading out and displaying data recorded in the memory card 25 for such purposes as confirmation of the photographing state. A personal computer interface 26 is used when transferring the data recorded in the memory card 25 to a personal computer 27. A CCD driver 28 generates a timing pulse or like signal for driving the CCD imaging device 11 under control of the CPU 18. A stop/shutter driver 29 drives the stop/shutter mechanism 13. A strobo mechanism 30 is controlled by the CPU 18 according to the AE data. An input key set 31 sets various read-out modes of the CCD imaging device, sets various photographing modes, drives of a trigger switch and so forth.

The construction of the CCD imaging device 11 will now be described. The CCD imaging device 11 is an inter-line type device having a pixel unit constituted by a number of pixels arranged in a two-dimensional array, and has a Bayer array of color filters. As shown in FIG. 2, the Bayer array of color filters has R (red) and G (green) filters arranged alternately in odd lines and G (green) and B (blue) filters arranged alternately in even lines, whereby the G (green) filters are in a lattice arrangement as a whole.

Figure 3:
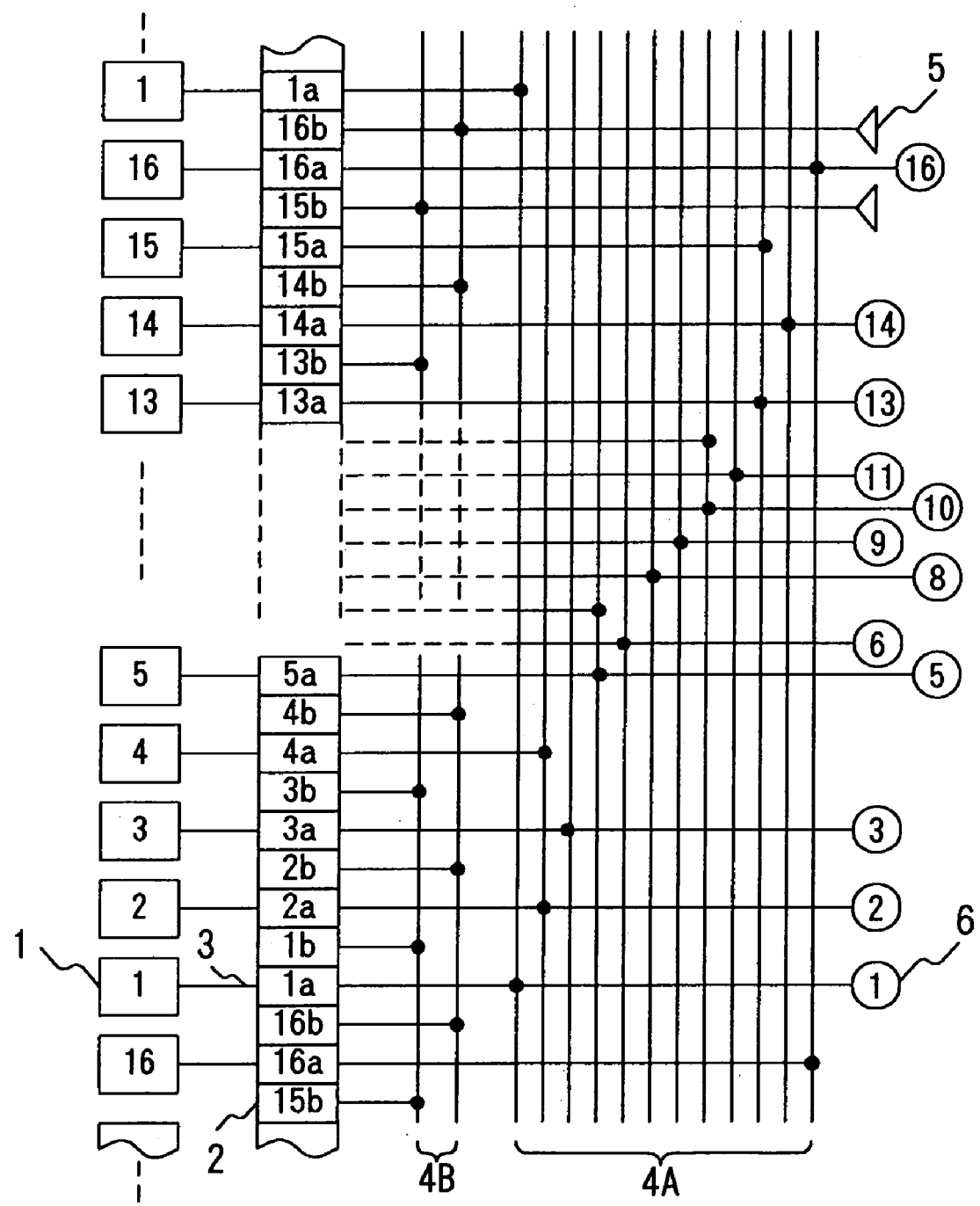
FIG. 3 is a fragmentary view showing a pixel column in the CCD imaging device shown in FIG. 1 and a corresponding vertical transfer path.

FIG. 3 partly shows a single vertical pixel column and a vertical transfer path 2 corresponding thereto. Like the CCD imaging device shown in FIG. 6, this CCD imaging device has a plurality of pixel groups 1, which are each constituted by 16 pixels in successive vertical arrangement and are successively arranged vertically along a vertical transfer path 2. The vertical transfer path 2 has two groups a and b of transfer electrodes 1a, 1b to 16a, 16b. Two like sequence transfer electrodes in the two electrode groups a and b are provided for each of the pixels 1 in each set. Each pixel 1 is connected via a shift gate 3 to each transfer channel in the vertical transfer path 2 corresponding to each of the transfer electrodes 1a to 16a in the electrode group a in the vertical transfer path 2. To the transfer electrodes 1a to 16a of the electrode group a, independent shift/transfer pulse application lead lines 4A are connected to permit gate pulse application and also independent gate pulse application to the shift gates. The respective pixels of the same order in the successively arranged pixel groups each of 16 pixels, that is, the line pixel corresponding to each coset of modulo 16, are connected to an independent shift/transfer pulse application common lead line. The number of the pixels in each of the successively arranged pixel groups is usually set to 8, 16, etc., but theoretically it may be a natural number between 4 and one half the number of pixels in each column.

As a feature of the present invention, in this embodiment one of the independent shift/transfer pulse application lead lines 4A is commonly connected to the transfer electrodes 2a and 4a. Likewise, the other ones of the independent shift/ transfer pulse application lead lines 4A are commonly connected to the transfer electrodes 5a and 7a, 10a and 12a, and 13a and 15a, respectively. With the four common shift/transfer pulse application lead lines 4A, in this embodiment a total of 12 shift/transfer pulse application lead lines are provided. Of the transfer electrodes in the vertical transfer path 2, those 1b to 16b in the electrode group b merely serve for the charge transfer, and two transfer pulse application lead lines 4B are connected to every 4-th transfer electrode, respectively.

Figure 6:
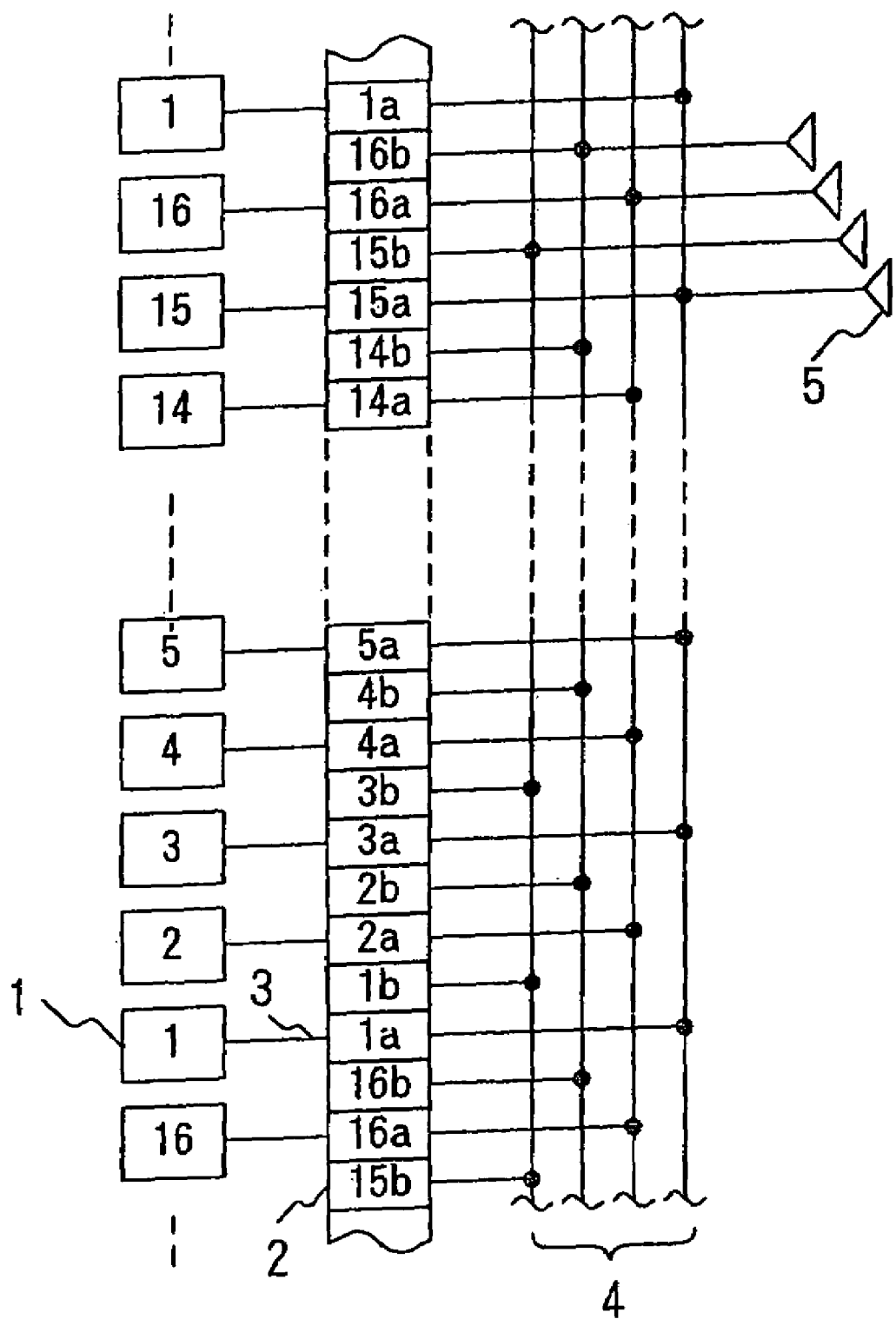
FIG. 6 is a fragmentary view showing a pixel column in a prior art 4-phase drive interlace type CCD imaging device.
Figure 7:
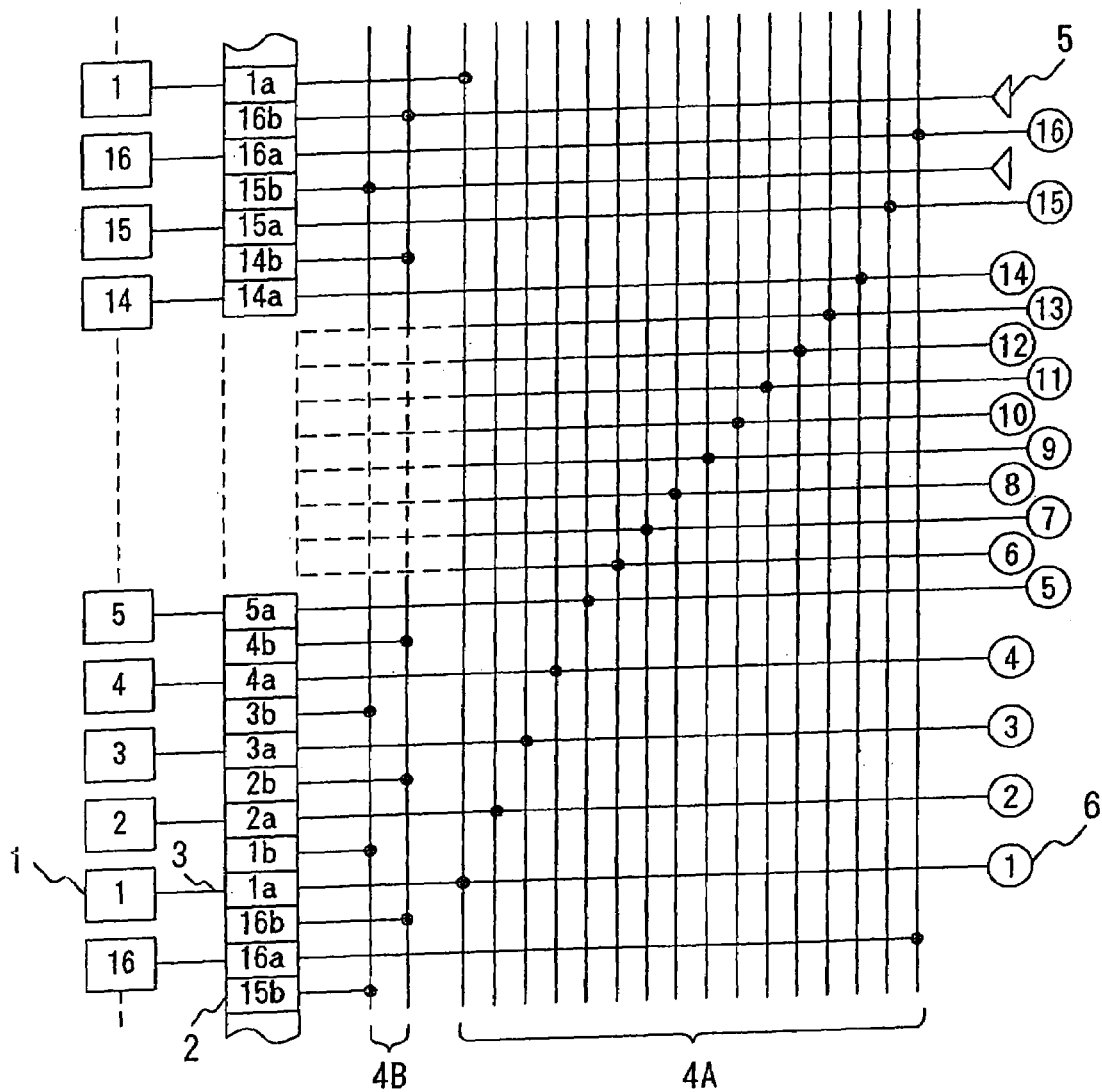
FIG. 7 is a fragmentary view showing a pixel column in a prior art CCD imaging device for 16-pixel unit 4-phase drive multiple rate read-out.

Transfer pulses are applied to the transfer electrodes 1a, 1b to 16a, 16b in a manner as in the construction shown in FIG. 6. Specifically, 4-phase shift pulses are applied to the two transfer pulse application lead lines 4B corresponding to the transfer electrodes 1b to 16b in the electrode group b and also to a plurality of selected ones of the independent or common shift/transfer pulse application lead lines 4A for 4-phase driving as in the CCD imaging device shown in FIG. 6. Also, a special drive such as a desired high rate (or multiple rate) read-out, is made possible by appropriately selective gate pulse application to the independent or common shift/transfer pulse application lead lines 4A.

A specific example of read-out of data from the CCD imaging device with the vertical transfer path having independent shift/transfer pulse application lead lines connected to the transfer electrode will now be described with reference to FIG. 4. In the Figure, the numerals in the left and right end columns denote orders of vertical arrangement of the pixels in one pixel group, constituted by 16 pixels in successive vertical arrangement. As for the showing of the read-out and non-read-out pixels in each read-out mode, every two pixels adjacent to each other in the horizontal direction of the Bayer array color filters are shown distinctively. The read-out pixels among the pixels in each 16-pixel set are shown shaded. The channel-like lines striding specific pixels, shown at the left end, each indicate common connection of an independent shift/transfer pulse application lead line to the transfer electrodes in the electrode group a, which correspond to the pixels shown coupled together by them.

In the embodiment of the solid-state imaging apparatus, the conventional interlace type read-out is made for usual high image quality still picture photographing. Although this read-out is not described in detail, data of all the pixels are naturally read out perfectly independently, and thus a high resolution can be obtained. On the other hand, it is a preamble to use a mechanical shutter in addition to the electronic shutter for obtaining image signals of the same accumulation time (or exposure degree) in two, i.e., odd and even, fields. Hereinunder various special drive read-out modes different from the full pixel read-out as the usual inter-lace type read-out will be described.

First, a double rate addition mode will be described as read-out mode. In this read-out mode, all the pixels are read out in two fields to obtain one frame image. The pixels which are read out in the first field, are shown shaded in an odd field column, as the timings of read-out of charge to the vertical transfer path (VCCD), and also the pixels read out in the second field are shown shaded in the even field column. This read-out is the same as the conventional inter-lace type read-out except for that at the instant of charge transfer from the vertical transfer path to the horizontal transfer path charge in every two read-out pixels are added together, thus effecting the double rate read-out. In this case, therefore, it is necessary to use the mechanical shutter in addition to the electronic shutter for obtaining image signals of the same accumulation time (or exposure degree) in the two, i.e., odd and even, fields.

A double rate non-addition mode will now be described. In the case of using the mechanical shutter, the shutter charging for the next shutter operation requires time. For this reason and also from the durability standpoint it is impossible to permit continuous operation. In the double rate non-addition read-out mode, pseudo non-interlace type read-out is made without use of any mechanical shutter. With the timings of read-out of charge to the vertical transfer path (VCCD), one-field image signal is read out twice, i.e., first read-out (and display) and second read-out (and display), in such short intervals of time as to hardly affect the charge storage times of the two read-out pixels, thus obtaining one-frame image signal.

Specifically, in the first timing pixel signals of the 2nd and 4-th pixels and those of the 10-th and 12-th pixels are read out for obtaining G and B signals, and in the second timing the pixel signals in the 5-th and 7-th pixels and those of the 13-th and 15-th pixels are read out in relation to the color filter array for obtaining R and G signals. These signals are all read out by transfer pulse application to common shift/ transfer pulse application lead lines.

Figure 5:
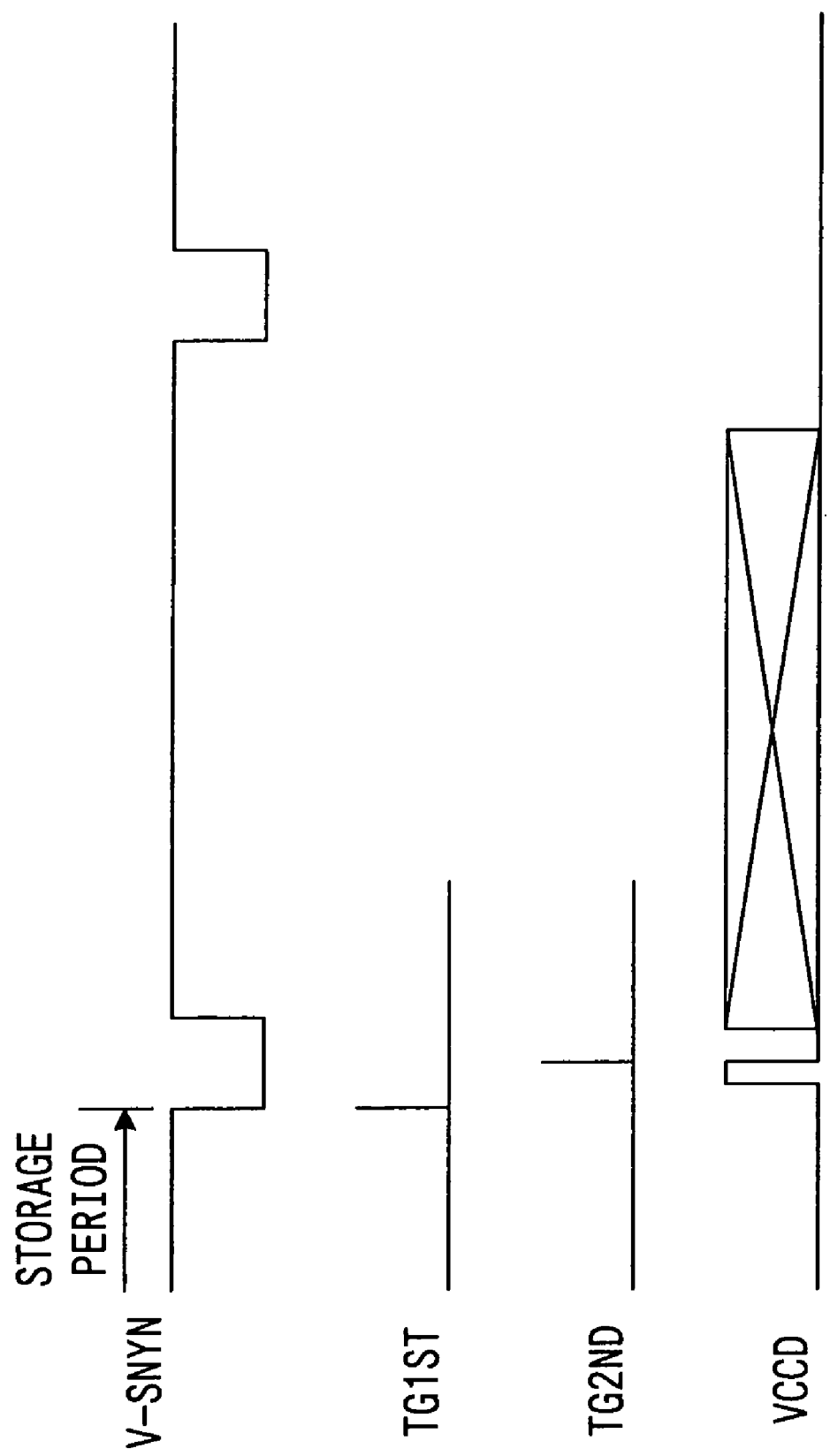
FIG. 5 is a timing chart for describing a read-out operation in a one-field twice read-out mode without use of any mechanical shutter in the embodiment shown in FIG. 3.

In this read-out, the 4-th and 5-th pixels, for instance, which are adjacent to each other, are read out successively in the first and second timings, respectively. Therefore, by merely setting short time interval read-out at the first and second timings, the pixel charges read out at the first and second times will be mixed together in the vertical transfer path thus making their independent transfer impossible. Accordingly, as shown in the time chart of FIG. 5, in this embodiment after charge of the 2nd, 4-th, 10-th and 12-th pixels have been read out via the shift gates thereof to the vertical transfer path (VCCD) under control of a gate pulse signal TG1*st* at the first timing, a shift pulse is applied to the vertical transfer path to cause vertical transfer by one step. Then, charge of the 5-th, 7-th, 13-th and 15-th are read out via the shift gates thereof to the vertical transfer path under control of a gate pulse signal TG2*nd* at the second timing.

With the provision of one-step vertical charge transfer between the first and second read-out timings as shown above, the charge of the 4-th and 5-th pixels are read out with an intervening one-step charge transfer channel, and are not read out to adjacent charge transfer channels, and it is thus possible to preclude the possibility of mixing of read-out charge.

The read-out charge are successively transferred along the vertical transfer path, and are added together in operation when they are transferred from the vertical transfer path to the horizontal transfer path. However, the pixel signals are read out such that every other one of them are thinned out between the first and second read-out timings. Thus, the vertical transfer is caused twice in each horizontal blanking period, and a pixel signal of one of two vertically successive pixels is read out in a non-addition state as signal charge. In this way, the double rate non-addition mode read-out is realized.

Four times rate modes will now be described as read-out mode, in which 4-pixel addition (or 4-line addition) is performed by 4-step vertical transfer in the vertical transfer path in one horizontal blanking period. As the four times rate mode, a 4/16 and an 8/16 mode exist. In the 4/16 mode, charge of 4 pixels among 16 pixels are read out. More specifically, 4-pixel addition is performed by 4-step vertical transfer of the charge in one horizontal blanking period, thus reading out signal charge for one read-out pixel. At the first timing, signals of the 6-th and 14-th pixels are read out and, at the second timing, signals of the 1-st and 9-th pixels are read out. Like the case of the double rate non-addition mode, one-step vertical transfer is performed between the first and second read-out timings. After reading out the pixels at the first and second timings, the 4-pixel addition is performed by the 4-step vertical transfer of the charge to the horizontal transfer path in each horizontal blanking period, thus transferring the signal charge for one read-out pixel to the horizontal transfer path. In the above way, the four times rate 4/16 mode read-out is realized.

The 8-16 mode in four times mode will now be described. In this mode, charge in 8 among 16 pixels are read out. More specifically, 4-pixel addition is performed by 4-step vertical transfer of charge in one horizontal blanking period, thus reading out signal charge for two read-out pixels. At the first timing signals of the 2-nd and 4-th pixels and those of the 13-th and 12-th pixels are read out, and at the second timing signals of the 5-th and 7-th pixels and those of the 13-th and 15-th pixels are read out. Again in this case, one-step vertical transfer is performed between the first and second read-out timings. After reading out the pixels at the first and second timings, the 4-pixel addition is performed by the 4-step vertical transfer of the charge of the horizontal transfer path in each horizontal blanking period, thus transferring the signal charge for two pixels to the horizontal transfer path. In the above way, the four times rate 8-16 read-out is realized.

Figure 4:
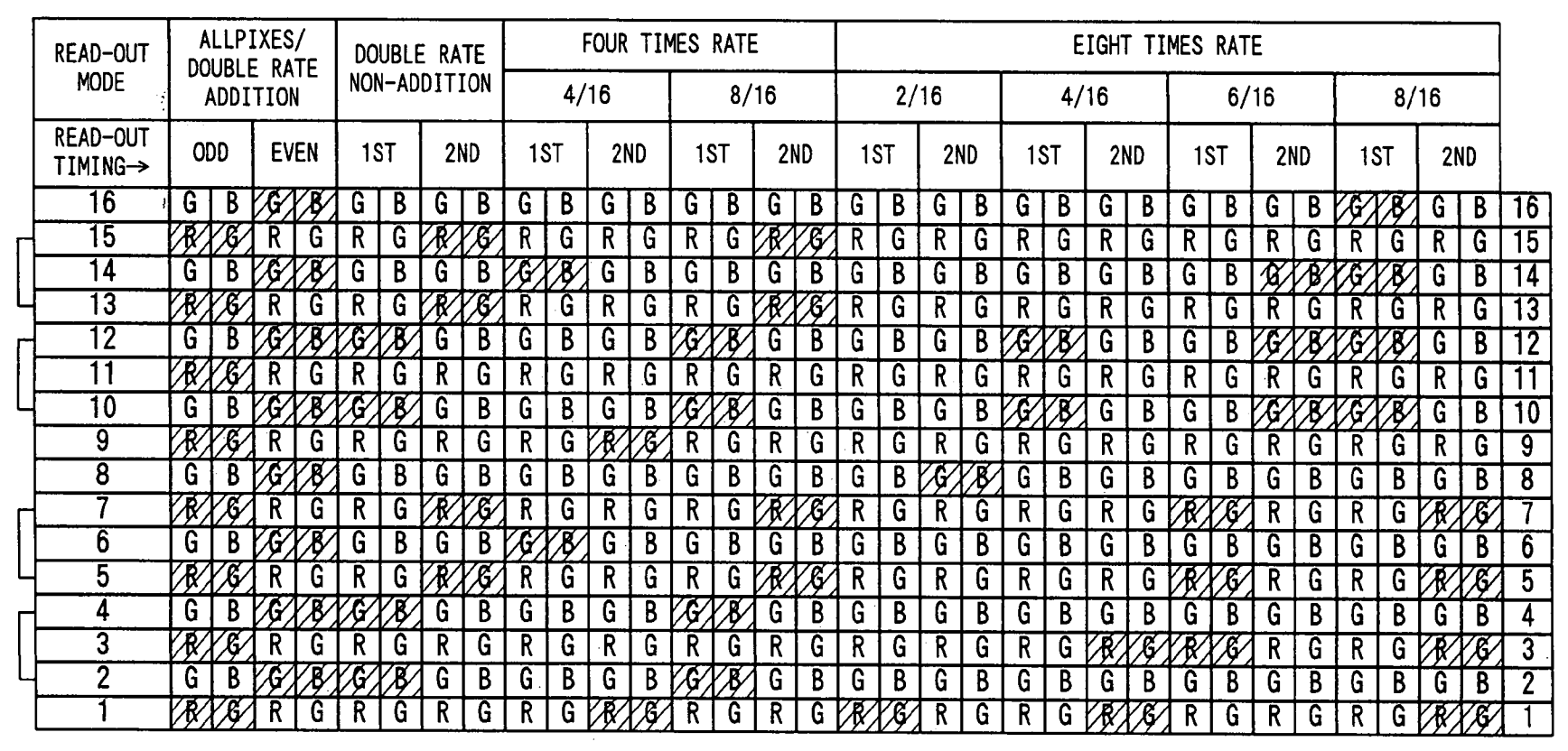

As is seen from the read-out pixel arrangement in the 16-pixel recurrence configuration shown in FIG. 4, the four times 4/16 and 8-16 modes, as well as the double rate addition and non-addition modes, permit read-out with the read-out pixel arrangement in the 8-pixel recurrence configuration. Thus, the four times rate 4/16 and 8/16 modes may also be called four times rate 2/8 and 4/8 modes.

Eight times rate modes will now be described. The eight times rate mode is required when taking out the auto-focus data, in which the image quality is not so important, in a CCD imaging device of about 4,000,000 pixels for coping with motion picture purposes such as view angle matching. In the case of the multiple rate read-out, for taking the color signals it is required, in relation to color filters, to read out at least 2-line in the case of the Bayer array and also 2-line read-out among 16 pixels in the case of the eight times rate read-out.

First, an eight times 2/16 mode will be described.

In this mode, 8-pixel addition (or 8-line addition) is performed by 8-step vertical transfer of the charge to the vertical transfer path in one horizontal blanking period, thus reading out signal charge for two pixels (or two lines). At the first timing, pixel signal of the first pixel (or 1st line) is read out and at the second timing, pixel signal of the 8-th pixel (or 8-th line) is read out. Again in this case, one-step vertical transfer is performed between the first and second read-out timings. After reading out the pixels at the first and second timings, 8-pixel addition (or 8-line addition) is performed by 8-step vertical transfer of the charge to the horizontal transfer path in each horizontal blanking period, thus transferring the signal charge for two pixels (or two lines) to the horizontal transfer path. In this way, the eight times rate 2/16 read-out is realized.

This eight times rate read-out mode is principally realizable by reading out the pixels in the 2nd and 9-th lines for the 2-line pixel read-out. According to the present invention, however, it is aimed to provide for common shift/transfer pulse application lead lines. In the case of reading out the 2nd and 9-th lines, one of the pixels of the 2nd and 9-th lines is a read-out pixel, while the other pixel is a non-read-out pixel. In this case, therefore, it is impossible to provide for common shift/transfer pulse application lead lines. For this reason, in this embodiment it is necessary to select the pixels of the 1st and 8-th lines, for instance, as in the above.

An eight times rate 4/16 mode will now be described. In this mode, the 8-pixel addition (or 8-line addition) is performed by 8-step vertical transfer of the charge to the vertical transfer path in one horizontal blanking period, thus reading out signal charge for four pixels (or four lines). At the first timing, signals of the 10-th and 12-th pixels (or lines), are read out and, at the second timing, signals of the 1st and 3-rd pixels (or lines) are read out. Again in this step, one-step vertical transfer is performed between the 1st and 2nd read-out timings. After reading out the pixels at the first and second timings, the 8-pixel addition (or 8-line addition) is performed by the 8-step vertical transfer of the charge to the horizontal transfer path in each horizontal blanking period, thus transferring the signal charge for four pixels or four lines) to the horizontal transfer path. In this way, the eight times rate 4/16 read-out mode is realized.

Likewise, in eight times rate 6/16 and 8-16 modes, the 8-pixel addition (or 8-line addition) is performed by the 8-step vertical transfer of the charge in one horizontal blanking period. In the 6/18 mode, signals of the 3-rd, 5-th and 7-th pixels are read out at the first timing, and signals of the 10-th, 12-th and 14-th pixels are read out at the second timing. In the 8/16 mode, signals of the 10-th, 12-th, 14-th and 16-th pixels are read out at the first timing, and signals of the 1st, 3-rd, 5-th and 7-th signals are read out at the second timing. Again in these cases, one-step vertical transfer is performed between the first and second read-out timings.

In the above eight times rate read-out modes, signals read out from two to eight pixels are added together. Where preference is given to the sensitivity, the 8/16 mode with large number of pixels (or lines) in the addition may be selected, while where a problem is posed by the saturation of transferred charge in the horizontal transfer path, the 2/16 mode with small number of pixels involved in the addition may be selected. In this way, the exemplified various modes of the same multiple rate read-out mode may be selectively set by taking various circumstances into consideration.

As has been shown in the above embodiment, the read-out modes as shown in FIG. 4 may be obtained by providing for common shift/transfer pulse application lead lines for the vertical transfer path. However, the provision of the shift/transfer pulse application lead lines for the vertical transfer path in the above embodiment is by no means limitative, and it is possible to set common lead lines in correspondence to various read-out modes. In this case, the transfer electrodes to be commonly connected are set such that the shift/transfer pulse application lead lines are as small in number as possible.

As has been described in connection with the above embodiment, according to the present invention common connection is provided for some of the gate electrodes, and it is thus possible to realize a solid-state imaging device capable of reducing the numbers of lead lines and connection electrodes for connecting the gate electrodes to an external circuit and capable of performing a special read-out, such as a desired multiple rate read-out.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A solid-state imaging device comprising:

a pixel unit constituted by a two-dimensional array of pixels for generating charge in correspondence to received light and accumulating the charge for a predetermined period of time;

a vertical transfer unit for vertically transferring charge from the pixels in the pixel unit, a horizontal transfer unit for horizontally transferring charge from the vertical transfer unit;

shift gates each provided between each pixel and the vertical transfer unit for reading out the charge in the pixels to the vertical transfer unit, gate electrodes for controlling the shift gates; and a plurality of lead lines for connecting the gate electrodes to an external circuit and a plurality of connection terminals for connecting the gate electrodes to the external circuit, the gate electrodes making up N of gate electrode groups in which the lines belonging to each coset of modulo N within successive pixel rows are connected to common lead lines, N being a predetermined natural number between 4 and one half the number of pixels in a column, and N also being the minimum periodic unit of connections from said gate electrodes having the same modulo N value and belonging to different gate electrode groups to said connection terminals within said successive pixel rows, the gate electrode groups having common connection terminals to (i) reduce the number of the connection terminals to less than N, and (ii) enable the gate electrodes having common connection terminals to be controlled with different timing from the timing of non-common connection terminals of the gate electrode groups.

2. A solid-state imaging device comprising:

a pixel unit constituted by a two-dimensional array of pixels for generating charge in correspondence to received light and accumulating the charge for a predetermined period of time;

a vertical transfer unit for vertically transferring charge from the pixels in the pixel unit, a horizontal transfer unit for horizontally transferring charge from the vertical transfer unit;

shift gates each provided between each pixel and the vertical transfer unit for reading out the charge in the pixels to the vertical transfer unit, gate electrodes for controlling the shift gates; and a plurality of lead lines for connecting the gate electrodes to an external circuit and a plurality of connection terminals for connecting the gate electrodes to the external circuit, gate control lines connected to gate electrode groups in which horizontal lines belonging to each coset of modulo N within successive pixel rows are connected commonly, N being a predetermined natural number between 4 and one half the number of pixels in a column, and N also being the minimum periodic unit of connections from said gate electrodes having the same modulo N value and belonging to different gate electrode groups to said connection terminals within said successive pixel rows, being combined with each other so as to (i) reduce the number of the connection terminals to less than N, and (ii) enable the gate electrodes having common connection terminals to be controlled with different timing from the timing of non-common connection terminals of the gate electrode groups.

3. A solid-state imaging device comprising:

a pixel unit constituted by a two-dimensional array of pixels for generating charge in correspondence to received light and accumulating the charge for a predetermined period of time;

a vertical transfer unit for vertically transferring charge from the pixels in the pixel unit, a horizontal transfer unit for horizontally transferring charge from the vertical transfer unit;

shift gates each provided between each pixel and the vertical transfer unit for reading out the charge in the pixels to the vertical transfer unit, gate electrodes for controlling the shift gates; and a plurality of lead lines for connecting the gate electrodes to an external circuit and a plurality of connection terminals for connecting the gate electrodes to the external circuit, the gate electrodes being provided in a predetermined number N of gate electrode groups such that horizontal line number of the gate electrode groups which are connected to respective common lead lines belong to each same residue class of modulo N, N being a predetermined natural number between 4 and one half the number of pixels in a column, and N also being the minimum periodic unit of connections from said gate electrodes having the same modulo N value and belonging to different gate electrode groups to said connection terminals within said successive pixel rows, some of the gate electrode groups being commonly connected (i) so that the connection terminals are less in number than N, and (ii) to enable the gate electrodes having common connection terminals to be controlled with different timing from the timing of non-common connection terminals of the gate electrode groups.

4. A solid-state imaging device comprising:

a pixel unit constituted by a two-dimensional array of pixels for generating charge in correspondence to received light and accumulating the charge for a predetermined period of time;

a vertical transfer unit for vertically transferring charge from the pixels in the pixel unit, a horizontal transfer unit for horizontally transferring charge from the vertical transfer unit;

shift gates each provided between each pixel and the vertical transfer unit for reading out the charge in the pixels to the vertical transfer unit, gate electrodes for controlling the shift gates; and a plurality of lead lines for connecting the gate electrodes to an external circuit and a plurality of connection terminals for connecting the gate electrodes to the external circuit, the gate electrodes making up N of gate electrode groups in which the lines belonging to each coset of modulo N within successive pixel rows are connected to common lead lines, N being a predetermined natural number between 4 and one half the number of pixels in a column, and N also being the minimum periodic unit of connections from said gate electrodes having the same modulo N value and belonging to different gate electrode groups to said connection terminals within said successive pixel rows, the gate electrode groups having common connections to (i) reduce the number of the connection terminals to less than N, and (ii) enable the gate electrodes having common connection terminals to be controlled with different timing from the timing of non-common connection terminals of the gate electrode groups, wherein the commonly connected gate electrode groups are always controlled in the same way in each of all predetermined read-out modes including selective pixel read-out modes by selective shift gate driving.

5. A solid-state imaging device comprising:

a pixel unit constituted by a two-dimensional array of pixels for generating charge in correspondence to received light and accumulating the charge for a predetermined period of time;

a vertical transfer unit for vertically transferring charge from the pixels in the pixel unit, a horizontal transfer unit for horizontally transferring charge from the vertical transfer unit;

shift gates each provided between each pixel and the vertical transfer unit for reading out the charge in the pixels to the vertical transfer unit, gate electrodes for controlling the shift gates; and a plurality of lead lines for connecting the gate electrodes to an external circuit and a plurality of connection terminals for connecting the gate electrodes to the external circuit, gate control lines connected to gate electrode groups in which the horizontal lines belonging to each coset of modulo N within successive pixel rows are connected commonly, N being a predetermined natural number between 4 and one half the number of pixels in a column, and N also being the minimum periodic unit of connections from said gate electrodes having the same modulo N value and belonging to different gate electrode groups to said connection terminals within said successive pixel rows, being combined with each other so as to (i) reduce the number of the connection terminals to less than N, and (ii) enable the gate electrodes having common connection terminals to be controlled with different timing from the timing of non-common connection terminals of the gate electrode groups, wherein the commonly connected gate electrode groups are always controlled in the same way in each of all predetermined read-out modes including selective pixel read-out modes by selective shift gate driving.

6. A solid-state imaging device comprising:

a pixel unit constituted by a two-dimensional array of pixels for generating charge in correspondence to received light and accumulating the charge for a predetermined period of time;

a vertical transfer unit for vertically transferring charge from the pixels in the pixel unit, a horizontal transfer unit for horizontally transferring charge from the vertical transfer unit;

shift gates each provided between each pixel and the vertical transfer unit for reading out the charge in the pixels to the vertical transfer unit, gate electrodes for controlling the shift gates; and a plurality of lead lines for connecting the gate electrodes to an external circuit and a plurality of connection terminals for connecting the gate electrodes to the external circuit, the gate electrodes being provided in a predetermined number N of gate electrode groups such that horizontal line number of the gate electrode groups which are connected to respective common lead lines belong to each same residue class of modulo N, N being a predetermined natural number between 4 and one half the number of pixels in a column, and N also being the minimum periodic unit of connections from said gate electrodes having the same modulo N value and belonging to different gate electrode groups to said connection terminals within said successive pixel rows, some of the gate electrode groups being commonly connected (i) so that the connection terminals are less in number than N, and (ii) to enable the gate electrodes having common connection terminals to be controlled with different timing from the timing of non-common connection terminals of the gate electrode groups, wherein the commonly connected gate electrode groups are always controlled in the same way in each of all predetermined read-out modes including selective pixel read-out modes by selective shift gate driving.

7. The solid-state imaging device according to claim 4, wherein gate electrode groups controlled in each of all the predetermined read-out modes are set such as to provide a minimum number of connection terminals for connecting the gate electrodes to an external circuit.

8. The solid-state imaging device according to claim 5 wherein gate electrode groups controlled in each of all the predetermined read-out modes are set such as to provide a minimum number of connection terminals for connecting the gate electrodes to an external circuit.

9. The solid-state imaging device according to claim 6 wherein gate electrode groups controlled in each of all the predetermined read-out modes are set such as to provide a minimum number of connection terminals for connecting the gate electrodes to an external circuit.

10. The solid-state imaging device of claim 1 wherein at least two horizontal lines belonging to the same pixel group but to different gate electrode groups are connected to a common connection terminal.

11. The solid-state imaging device of claim 2 wherein at least two horizontal lines belonging to the same pixel group but to different gate electrode groups are connected to a common connection terminal.

12. The solid-state imaging device of claim 3 wherein at least two horizontal lines belonging to the same pixel group but to different gate electrode groups are connected to a common connection terminal.

13. The solid-state imaging device of claim 4 wherein at least two horizontal lines belonging to the same pixel group but to different gate electrode groups are connected to a common connection terminal.

14. The solid-state imaging device of claim 5 wherein at least two horizontal lines belonging to the same pixel group but to different gate electrode groups are connected to a common connection terminal.

15. The solid-state imaging device of claim 6 wherein at least two horizontal lines belonging to the same pixel group but to different gate electrode groups are connected to a common connection terminal.

16. The solid-state imaging device of claim 1 wherein only two connection terminals connected to said vertical transfer unit are not connected to any of the gate electrodes.

17. The solid-state imaging device of claim 2 wherein only two connection terminals connected to said vertical transfer unit are not connected to any of the gate electrodes.

18. The solid-state imaging device of claim 3 wherein only two connection terminals connected to said vertical transfer unit are not connected to any of the gate electrodes.

19. The solid-state imaging device of claim 4 wherein only two connection terminals connected to said vertical transfer unit are not connected to any of the gate electrodes.

20. The solid-state imaging device of claim 5 wherein only two connection terminals connected to said vertical transfer unit are not connected to any of the gate electrodes.

21. The solid-state imaging device of claim 6 wherein only two connection terminals connected to said vertical transfer unit are not connected to any of the gate electrodes.

22. The solid-state imaging device of claim 1 wherein connections from said gate electrodes to said connection terminals within successive pixel rows have a periodic repetition, and wherein N is the minimum period of repetition.

23. The solid-state imaging device of claim 1 wherein connections from said gate electrodes to said connection terminals within successive pixel rows exhibit a repeating pattern, and wherein N is the minimum period of the repeating pattern.

* * * * *